US010631429B2

(12) United States Patent
Pradeepkumar et al.

(10) Patent No.: US 10,631,429 B2
(45) Date of Patent: Apr. 21, 2020

(54) VEHICLE POWER MODULE ASSEMBLY

(71) Applicant: Ford Global Technologies, LLC, Dearborn, MI (US)

(72) Inventors: Akash Changarankumarath Pradeepkumar, Westland, MI (US); Alfredo R. Munoz, Ann Arbor, MI (US); Michael W. Degner, Novi, MI (US); Edward Jih, Troy, MI (US); Guangyin Lei, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/034,950

(22) Filed: Jul. 13, 2018

(65) Prior Publication Data
US 2020/0022278 A1  Jan. 16, 2020

(51) Int. Cl.
*H05K 7/00* (2006.01)
*H05K 7/14* (2006.01)
*H05K 7/18* (2006.01)
*H01M 2/10* (2006.01)
H05K 9/00 (2006.01)
B60K 1/04 (2019.01)
B60L 50/60 (2019.01)

(52) U.S. Cl.
CPC ........ *H05K 7/1474* (2013.01); *H01M 2/1077* (2013.01); *H05K 7/18* (2013.01); *B60K 1/04* (2013.01); *B60L 50/66* (2019.02); *H05K 9/0062* (2013.01)

(58) Field of Classification Search
None
See application file for complete search history.

(56) References Cited

U.S. PATENT DOCUMENTS

| 4,384,368 | A | 5/1983 | Rosenfeldt et al. |
| 5,157,590 | A | 10/1992 | Barthel et al. |
| 7,607,502 | B2 * | 10/2009 | Boville .................. B60R 11/00 180/68.5 |
| 7,726,427 | B2 * | 6/2010 | Picavet ............... H01M 2/1083 180/68.5 |
| 7,826,232 | B2 | 11/2010 | Von Arx et al. |
| 8,162,191 | B2 * | 4/2012 | Tetsuka .................... B62J 11/00 224/441 |

(Continued)

*Primary Examiner* — Jinhee J Lee
*Assistant Examiner* — Rashen E Morrison
(74) *Attorney, Agent, or Firm* — Brooks Kushman PC; David Kelley

(57) ABSTRACT

A vehicle power module assembly including an array of stacked switch unit assemblies, a front cover, first and second side rails, and an end cover is provided. Each of the assemblies may include a power stage frame having a mid-cutout located at a substantially central side frame region such that a mid-cutout region is defined along each side of the array. The front cover may be disposed at a first end of the array. The first and second side rails may each extend from the front cover and each may be disposed within one of the mid-cutout regions such that an outer surface of each side rail is substantially flush with an outer surface of a respective power stage frame. The end cover may be arranged with the front cover to retain the assemblies therebetween. The assembly may further include a clamping plate and a spring element.

18 Claims, 10 Drawing Sheets

(56) References Cited

U.S. PATENT DOCUMENTS

| | | | | |
|---|---|---|---|---|
| 8,808,894 B2* | 8/2014 | Munro | B60R 16/04 | 429/100 |
| 9,666,845 B2* | 5/2017 | Hayashida | H01M 2/1061 | |
| 9,978,998 B2* | 5/2018 | Choi | H01M 2/1016 | |
| 10,266,136 B2* | 4/2019 | Toyoda | B60R 16/04 | |
| 10,322,689 B1* | 6/2019 | Oyama | B60R 16/04 | |
| 10,377,217 B1* | 8/2019 | Pradeepkumar | B60K 1/04 | |
| 2005/0225283 A1* | 10/2005 | Boville | B60R 16/04 | 320/107 |
| 2008/0280194 A1* | 11/2008 | Okada | H01M 2/1077 | 429/99 |
| 2011/0151311 A1* | 6/2011 | Lee | H01M 2/1077 | 429/156 |
| 2011/0287285 A1* | 11/2011 | Yoon | B60L 1/003 | 429/9 |
| 2012/0121950 A1* | 5/2012 | Lim | H01M 2/1211 | 429/88 |
| 2012/0313559 A1* | 12/2012 | Tonomura | H01M 2/1077 | 318/139 |
| 2013/0330584 A1* | 12/2013 | Lee | H01M 10/482 | 429/91 |
| 2015/0104686 A1* | 4/2015 | Brommer | H01M 2/1077 | 429/99 |
| 2015/0140409 A1* | 5/2015 | Sakurai | H01M 2/202 | 429/159 |
| 2015/0349394 A1* | 12/2015 | Hayashida | H01M 10/6551 | 429/120 |
| 2016/0240827 A1* | 8/2016 | Sakurai | H01M 2/1077 | |
| 2016/0308480 A1* | 10/2016 | Wang | B60L 11/1803 | |
| 2016/0309624 A1* | 10/2016 | Lei | H05K 7/20927 | |
| 2017/0194680 A1* | 7/2017 | Muck | H01M 10/625 | |
| 2017/0259691 A1* | 9/2017 | Lei | H01M 10/625 | |
| 2017/0331164 A1* | 11/2017 | Kwon | H01M 10/647 | |
| 2017/0347484 A1* | 11/2017 | Lei | B60K 6/48 | |

* cited by examiner

VEHICLE POWER MODULE ASSEMBLY

TECHNICAL FIELD

The present disclosure relates to components of vehicle power module assemblies.

BACKGROUND

A vehicle power unit may be formed by stacking and connecting a number of power modules based on power requirements. Pins from the power modules interface with adjacent power electronics.

SUMMARY

A vehicle power module assembly includes an array of stacked switch unit assemblies, a front cover, first and second side rails, and an end cover. Each of the assemblies includes a power stage frame having a mid-cutout located at a substantially central side frame region such that a mid-cutout region is defined along each side of the array. The front cover is disposed at a first end of the array. The first and second side rails each extend from the front cover and each is disposed within one of the mid-cutout regions such that an outer surface of each side rail is substantially flush with an outer surface of a respective power stage frame. The end cover is arranged with the front cover to retain the assemblies therebetween. The assembly may further include a clamping plate and a spring element. The clamping plate may be for mounting to a second end of the array. The spring element may be for mounting to the clamping plate such that the spring element is compressed against the clamping plate and the end cover when the front cover and end cover are secured to one another. Each of the first and second side rails may be integrated with the front cover and shaped to define a rectangle. Each of the first and second side rails may include a first mating feature to connect with a second mating feature of the end cover. The rectangle may include an upper side extending along an upper portion of the array and a lower side extending along a lower portion of the array. Each of the first and second side rails may define a groove extending a length of a respective side rail and spaced above a respective lower side rail portion. Each of the power stage frames may further define an extension sized for disposal within one of the grooves. The front cover may include a pair of T-shaped locating cutouts and the end cover may include a pair of locating cutouts and a pair of through-holes. Each of the first and second side rails may be a component separate from the front cover, include a T-shaped end sized to sit within one of the pair of T-shaped locating cutouts, and include a wave tab sized such that a portion of a respective side rail sits within one of the pair of locating cutouts of the end cover while a portion of a respective wave tab sits within one of the pair of through-holes. An intermediate plate may be disposed between two switch unit assemblies at a substantially central region of the array of stacked switch unit assemblies and may include a first fastening feature for securement to the front cover, another set of side rails each extending therefrom and disposed within respective cutout regions, and a second fastening feature for securement to the end cover. Each of the another pair of side rails may be aligned in parallel with the first and second side rails. The assembly may further include an intermediate plate disposed between two switch unit assemblies at a substantially central region of the array of stacked switch unit assemblies and may include a pair of upper side rails and a pair of lower side rails. Each power stage frame may further define an upper cutout region and a lower cutout region. The power stage frames may be aligned such that the upper cutout regions and the lower cutout regions each extend along a length of the array on either side. The intermediate plate may be arranged with the array of stacked switch unit assemblies such that each of the pair of upper side rails sits within one of the upper cutout regions and each of the pair of lower side rails sits within one of the lower cutout regions.

A vehicle power module assembly includes a housing, a front cover, an end cover, an array of stacked switch unit assemblies, and an intermediate plate. The housing includes a vertical member and a horizontal member. The front cover is for securing to the vertical member and includes first and second side rails each including a first portion of a first fastening feature. The end cover is for securing to the horizontal member and includes first portions of a second fastening feature each disposed on opposing sides of the end cover. The array of stacked switch unit assemblies is disposed between the covers and includes a plurality of frames housing power stages. The intermediate plate is centrally disposed within the array and includes a third side rail, a fourth side rail, second portions of the first fastening feature, and second portions of the second fastening feature. Each of the plurality of frames defines a mid-cutout to receive a portion of one of the side rails when the first and second portions of the first fastening feature are secured to one another and the first and second portions of the second fastening feature are secured to one another. The vertical member may define a coolant inlet and a coolant outlet each in fluid communication with the array of stacked switch unit assemblies for coolant delivery and coolant removal. The intermediate plate may further include first and second portions of a third fastening feature. The horizontal member may include third and fourth portions of the third fastening feature for alignment with respective first and second portions of the third fastening feature to secure the intermediate plate to the horizontal member and to increase a structural rigidity of the power module assembly. The front cover and the end cover may be arranged with one another to orient the intermediate plate as a heat sink. Each of the plurality of frames may define an upper cutout and a lower cutout with the mid-cutout therebetween. The intermediate plate may further include a fifth side rail and a sixth side rail. The intermediate plate may be arranged with the array of stacked switch unit assemblies such that the third side rail and the fourth side rail are disposed within one of the upper cutout and the lower cutout and the fifth side rail and the sixth side rail are disposed within the other of the upper cutout and the lower cutout. Each of the first and second side rails may define a length substantially equal to at least a width of two of the plurality of frames. The covers, side rails, and frames may be arranged with one another such that array of switch unit assemblies is sealed when stacked due to a compression force received from the side rails.

A vehicle power module assembly includes a housing, a cover, and an array of switch unit assemblies. The housing defines a cavity and a through-hole. The cover includes a plate defining a plate area greater than a through-hole area, and includes first and second side rails extending from the plate through the through-hole. The array of switch unit assemblies is within the cavity. Each of the side rails extends a length substantially equal to a length of at least two of the switch unit assemblies. The plate may include an integrated coolant inlet and an integrated coolant outlet. Each of the integrated coolant inlet and the integrated coolant outlet may define a coolant channel in fluid communication with the array of switch unit assemblies for coolant delivery and removal. The assembly may further include a spring element. The housing may include a spring holding feature located opposite the through-hole and arranged upon the housing to retain the spring element at a location such that the array of switch unit assemblies is sealed when stacked due to a compression force received from the cover to the housing. The housing may further define one or more housing apertures each located adjacent one of four corners of the through-hole. The cover may further define one or more cover apertures each corresponding to one of the one or more housing apertures. Each of the one or more housing apertures may be in substantial registration with one of the one or more cover apertures to receive a fastener. The one or more housing apertures and the one or more cover apertures may be arranged with one another such that the plate covers the through-hole when secured to the housing. Each of the array of switch unit assemblies may include a frame to retain at least two switch units therein. Each of the first and second side rails may define a height substantially equal to a height of one of the frames and the height may be greater than a length defined by each of the first and second side rails. Each of the array of switch unit assemblies may include a frame to retain at least two switch units therein. Each of the first and second side rails may include a groove extending a length thereof and spaced above a respective lower rail portion. Each of the frames may define an extension sized for disposal within one of the grooves.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
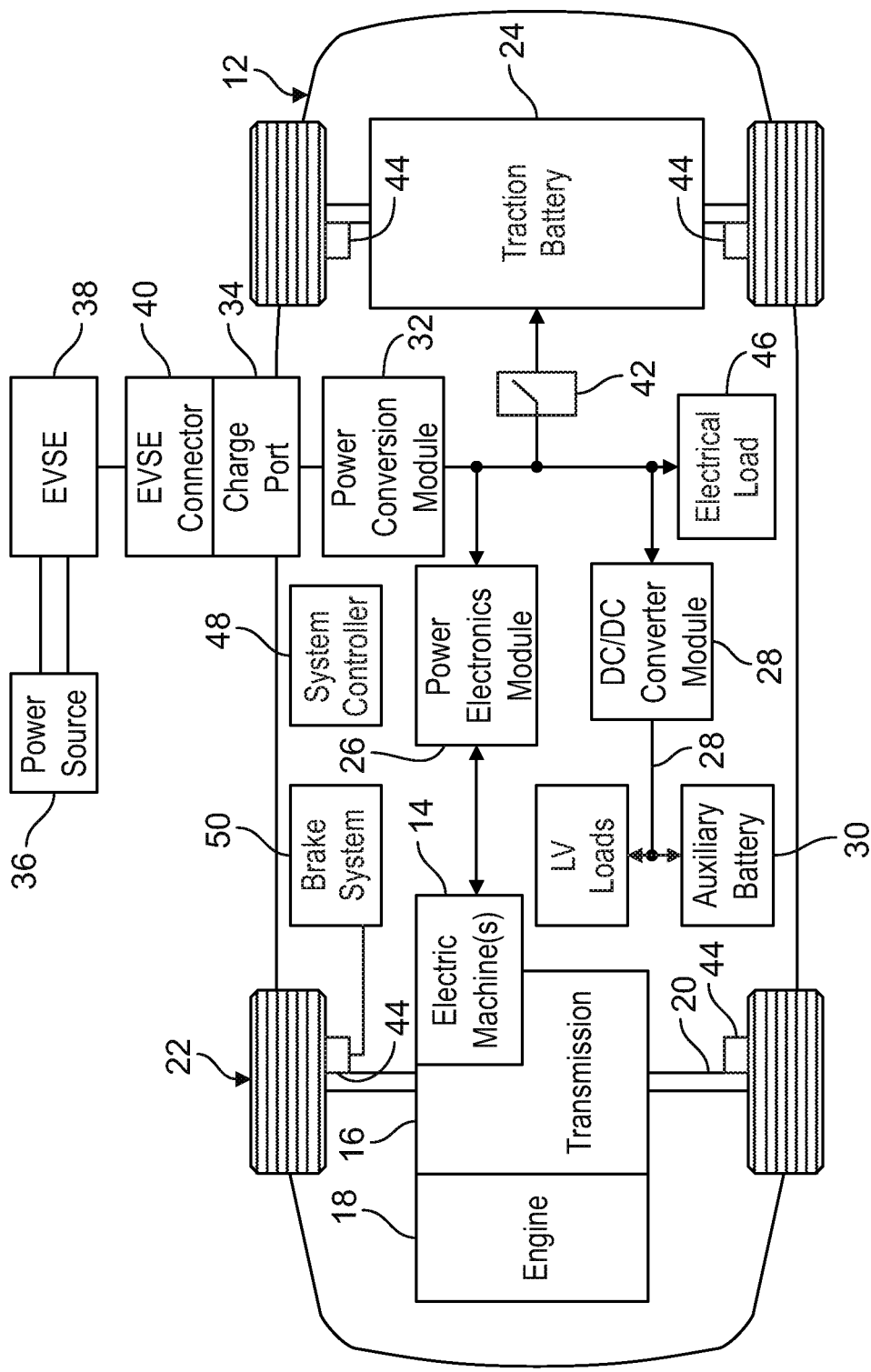
FIG. 1 is a schematic diagram illustrating an example of an electrified vehicle.

FIG. 1 is a schematic diagram illustrating an example of an electrified vehicle, referred to as an electrified vehicle 12 herein. In this example, the electrified vehicle is shown as a plug-in hybrid electric vehicle (PHEV). The electrified vehicle 12 may include one or more electric machines 14 mechanically coupled to a gearbox or hybrid transmission 16. Each of the electric machines 14 may be capable of operating as a motor and a generator. In addition, the hybrid transmission 16 is mechanically coupled to an engine 18 and the hybrid transmission 16 is mechanically coupled to a drive shaft 20 that is mechanically coupled to a set a set of wheels 22. The electric machines 14 may provide propulsion and deceleration capability when the engine 18 is turned on or off. The electric machines 14 may also act as generators and provide fuel economy benefits by recovering energy that would normally be lost as heat in a friction braking system. The electric machines 14 may also reduce vehicle emissions by allowing the engine 18 to operate at more efficient speeds and allowing the electrified vehicle 12 to be operated in electric mode with the engine 18 off under certain conditions. The electrified vehicle 12 may also be a battery electric vehicle (BEV), a full hybrid electric vehicle (FHEV), a mild hybrid electric vehicle (MHEV), or other vehicle utilizing an electric drive and/or an electric motor. In a BEV configuration, the engine 18 may not be present.

A battery pack or traction battery 24 stores energy that may be used by the electric machines 14. The traction battery 24 may provide a high voltage direct current (DC) output. A contactor module 42 may include one or more contactors to isolate the traction battery 24 from a high-voltage bus 52 when opened and to connect the traction battery 24 to the high-voltage bus when closed. The high-voltage bus may include power and return conductors for carrying current. The contactor module 42 may be located adjacent to or within the traction battery 24. One or more power electronics modules 26 (which may also be referred to as an inverter or power module) may be electrically coupled to the high-voltage bus. The power electronics modules 26 are electrically coupled to the electric machines 14 and provide the ability to bi-directionally transfer energy between the traction battery 24 and the electric machines 14. For example, a traction battery 24 may provide a DC voltage while the electric machines 14 may operate with a three-phase alternating current (AC). The power electronics module 26 may convert the DC voltage to a three-phase AC current to operate the electric machines 14. In a regenerative mode, the power electronics module 26 may convert the three-phase AC current from the electric machines 14 acting as generators to the DC voltage compatible with the traction battery 24.

In addition to providing energy for propulsion, the traction battery 24 may provide energy for other vehicle electrical systems. The electrified vehicle 12 may include a DC/DC converter module 28 that converts the high voltage DC output from the high-voltage bus to a low-voltage DC level of a low-voltage bus that is compatible with low-voltage loads 45. An output of the DC/DC converter module 28 may be electrically coupled to an auxiliary battery 30 (e.g., a 12V battery) for charging the auxiliary battery 30. The low-voltage loads 45 may be electrically coupled to the auxiliary battery 30 via the low-voltage bus. One or more high-voltage electrical loads 46 may be coupled to the high-voltage bus. The high-voltage electrical loads 46 may have an associated controller that operates and controls the high-voltage electrical loads 46 when appropriate. Examples of high-voltage electrical loads 46 may be a fan, an electric heating element and/or an air-conditioning compressor.

In a PHEV embodiment, the electrified vehicle 12 may be configured to recharge the traction battery 24 via an external power source 36. The external power source 36 may include a connection to an electrical outlet. The external power source 36 may be electrically coupled to a charge station or an electric vehicle supply equipment (EVSE) 38. The external power source 36 may be an electrical power distribution network or grid as provided by an electric utility company. The EVSE 38 may provide circuitry and controls to regulate and manage the transfer of energy between the external power source 36 and the electrified vehicle 12. The external power source 36 may provide DC or AC electric power to the EVSE 38. The EVSE 38 may have a charge connector 40 for coupling to a charge port 34 of the vehicle 12. The charge port 34 may be any type of suitable port configured to transfer power from the EVSE 38 to the vehicle 12. The charge port 34 may be electrically coupled to an on-board power conversion module 32 which may operate as a charger. The power conversion module 32 may condition the power supplied from the EVSE 38 to provide appropriate voltage and current levels to the traction battery 24 and the high-voltage bus. The power conversion module 32 may interface with the EVSE 38 to coordinate the delivery of power to the electrified vehicle 12. The EVSE connector 40 may have pins to mate with corresponding recesses of the charge port 34.

One or more wheel brakes 44 may be provided for decelerating the electrified vehicle 12 and preventing motion of the electrified vehicle 12. The wheel brakes 44 may be hydraulically actuated, electrically actuated, or some combination thereof. The wheel brakes 44 may be a part of a brake system 50. The brake system 50 may include other components to operate the wheel brakes 44.

Figure 2:
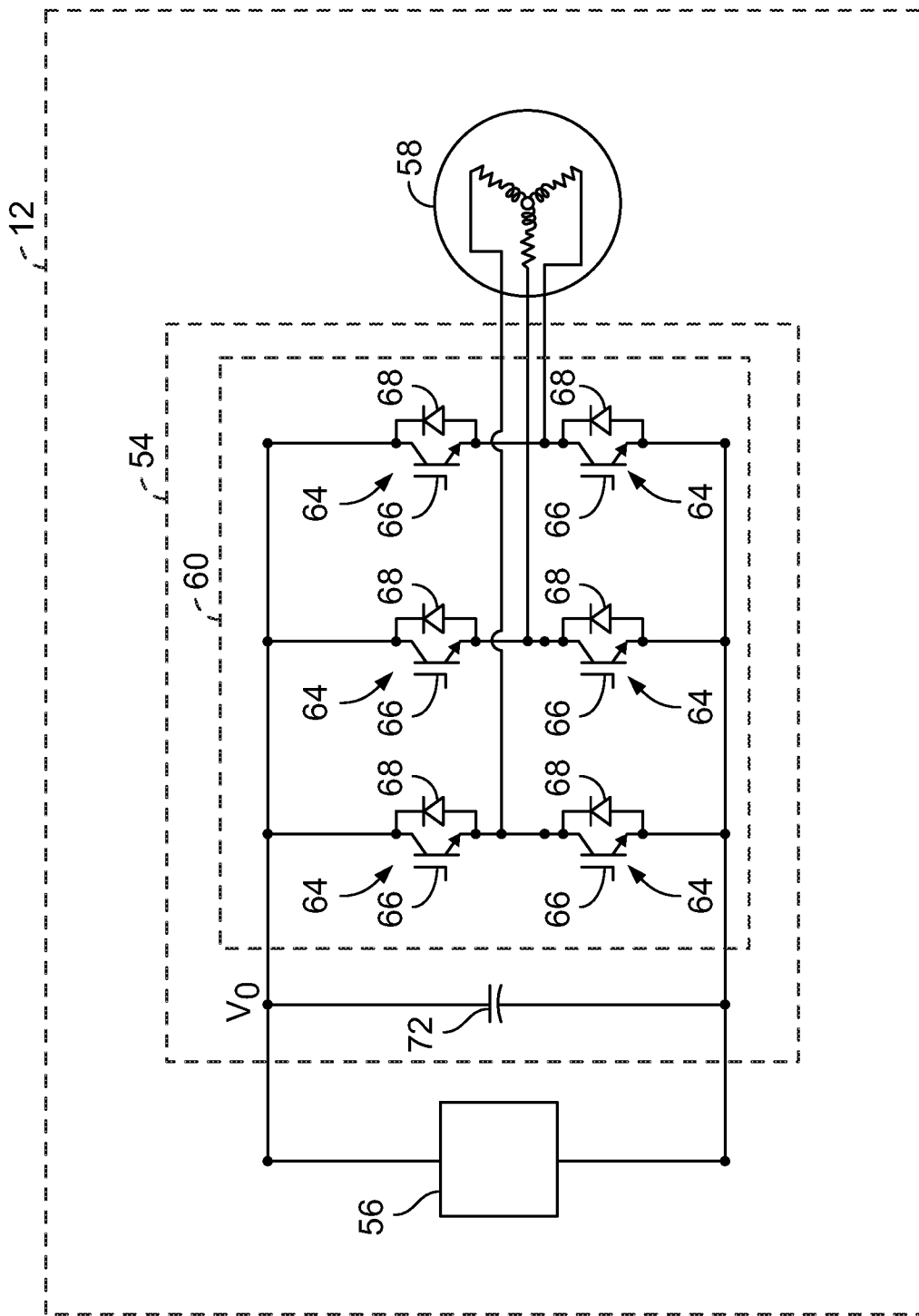
FIG. 2 is a schematic diagram illustrating a variable voltage converter and power inverter.

FIG. 2 is a circuit diagram illustrating an example of a power supply device 54 coupled to a power source 56 and a load 58. The power supply device 54 may convert DC electrical current into AC electrical current. The power supply device 54 may be utilized in an electric drive system of a vehicle, such as the electrified vehicle 12 described above. The power source 56 may be coupled to the power supply device 54 in order to drive the load 58. The power source 56 may be a battery, such as the traction battery 24 described above, and the load 58 may be an electric machine, such as one of the electric machines 14 described above. The power source 56 may further comprise a high voltage battery that is coupled to a voltage converter (not shown). The power supply device 54 may include a power assembly or power module 60. The power module 60 may deliver electrical power to the load 58. The power module 60 may be an inverter or an inverter assembly to convert DC electrical current into AC electrical current.

The power module 60 may include inverting circuitry and heat generating components such as a plurality of switching units 64. The power module 60 may be an inverter that includes any number of switching units and is not limited to the number of switching units shown in FIG. 1. Each of the switching units 64 may include a transistor 66 arranged antiparallel with a diode 68. In one example, the transistor 66 may be an insulated gate bipolar transistor (IGBT). The switching units 64 may provide alternating current to the load 58. The power supply device 54 may include a linking capacitor 72 disposed between the power source 56 and the power module 60. The linking capacitor 72 may absorb ripple currents generated at the power module 60 or the power source 56, and stabilize the DC-link voltage, Vo, for power module 60 control. The linking capacitor 72 may be arranged to limit voltage variation at an input of inverting circuitry due to ripple currents generated by the inverting circuitry in the power module 60 or a battery, such as a traction battery, that may comprise the power source 56. Alternatively, the linking capacitor 72 may be configured to couple one or a plurality of inverters to a power source.

Figure 3:
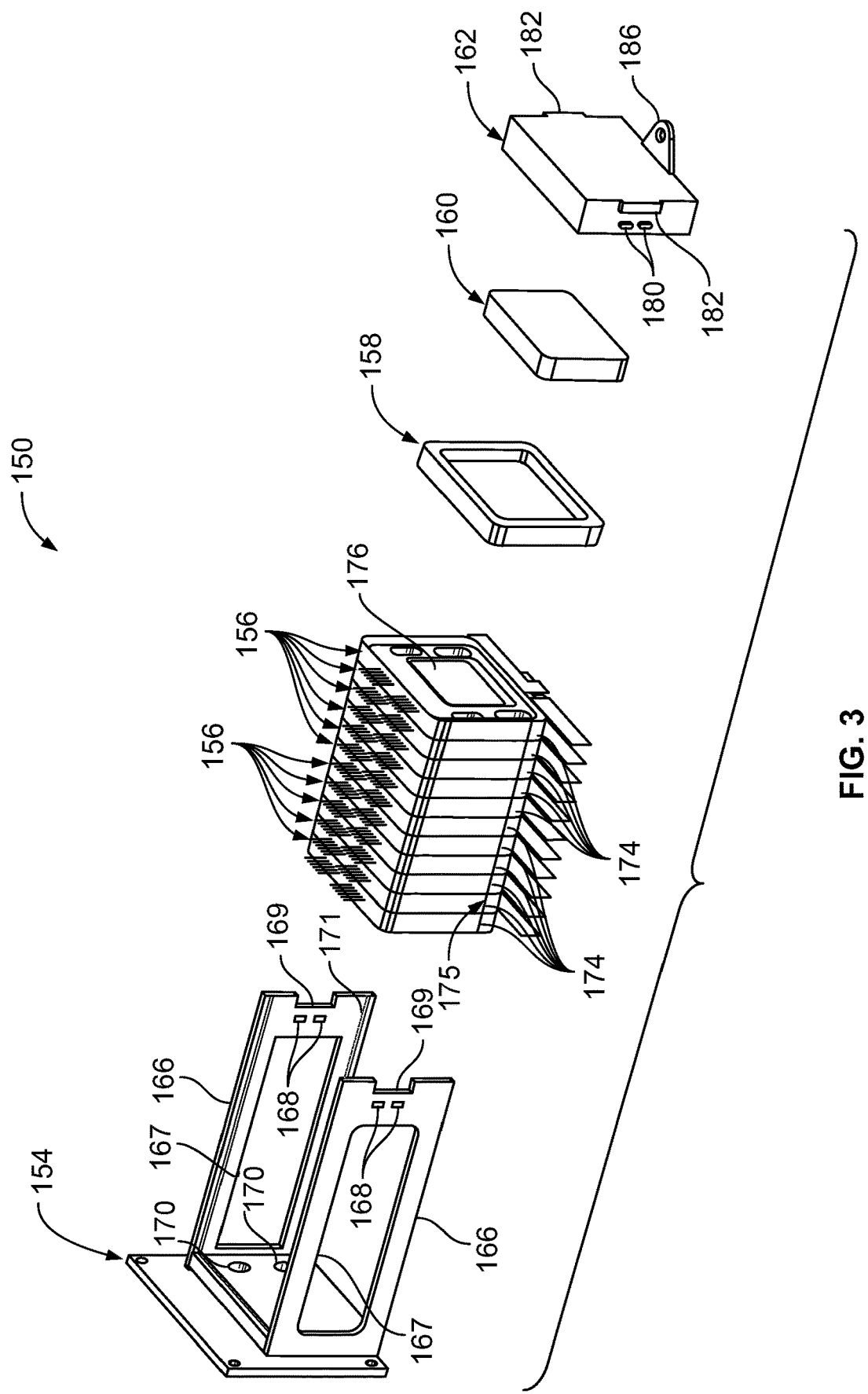
FIG. 3 is a partially exploded perspective view of an example of a portion of a power module assembly.

FIG. 3 is a partially exploded perspective view illustrating an example of a portion of a power module assembly, referred to generally as a power module assembly 150 herein. The power module assembly 150 may include a front cover 154, an array of stacked power stage assemblies 156, a clamp plate 158, a spring component 160, and an end cover 162. The clamp plate 158 and the spring component 160 may be arranged with one another when the power module assembly 150 is assembled to assist in facilitating a clamping relationship to provide a sealing relationship between the array of stacked power stage assemblies 156 to promote a consistent coolant pressure and consistent coolant flow rate of coolant throughout the power module assembly 150.

A pair of side rails 166 extends from the front cover 154. Each of the pair of side rails 166 may be formed integrally with the front cover 154. Each of the pair of side rails 166 may define a rectangular shape about a through-hole 167. The rectangular shape may include vertical and horizontal sides surrounding the through-hole 167. The side rails 166 and the end cover 162 may include one or more features to facilitate securement to one another. For example, each of the pair of side rails 166 may include one or more receiving apertures 168 and a notch 169 at a rail end located opposite the front cover 154. Each of the pair of side rails 166 may be sized to extend a length of the array of stacked power stage assemblies 156 plus a width of the clamp plate 158, the spring component 160, and the end cover 162. Each of the pair of side rails 166 may define a groove 171 to assist in securing the front cover 154 to the array of stacked power stage assemblies 156. In FIG. 3, only one of the grooves 171 is visible due to an orientation of the front cover 154. The front cover 154 may define inlet/outlet ports 170 to provide a channel to facilitate coolant delivery and removal to assist in managing thermal conditions of the array of stacked power stage assemblies 156.

Each of the power stage assemblies 156 may include a housing 174 and a power stage 176 disposed therein. Electrical connectors may extend from each power stage 176. Each of the housings 174 may include apertures for the electrical connectors to extend therethrough. In one example, the electrical connectors may extend above and below a respective housing 174 to connect with a neighboring unit such as a gate drive, a capacitor, a DC busbar, or an AC busbar. Each of the housings 174 may define an extension such that an extension 175 extends along a length of the array of power stage assemblies 156 when stacked. In FIG. 3, only one of the extensions 175 is visible due to an orientation of the stacked power stage assemblies 156. The front cover 154 and the array of power stage assemblies 156 may be arranged with one another such that the extensions 175 may each interlock with one of the grooves 171.

The clamp plate 158 may operate with the spring component 160 to assist in snugly retaining the array of stacked power stage assemblies 156 between the front cover 154 and the end cover 162. The snug retention facilitates a sealed relationship between the front cover 154, each of the power stage assemblies 156, and the end cover 162 to minimize or eliminate leakage of coolant introduced to the array of stacked power stage assemblies 156. The snug retention also facilitates benefits relating to noise, vibration, and harshness standards to reduce a stress on components compressed against one another. For example, the end cover 162 may be secured to the front cover 154 to retain the array of stacked power stage assemblies 156, the clamp plate 158, and the spring component 160 therebetween. The end cover 162 may include one or more extensions 180 and a pair of extrusions 182 (the one or more extensions 180 are visible on only one side of the end cover 162 in FIG. 3 due to an orientation of the end cover 162). Each of the one or more extensions 180 may be sized for insertion within one of the one or more receiving apertures 168 to assist in securing the side rails 166 to the end cover 162. Each of the extrusions 182 may be sized to sit within one of the notches 169 to assist in securing the side rails 166 to the end cover 162. The one or more receiving apertures 168, the notches 169, the extensions 180, and the extrusions 182 may also operate as locating assistance features to align the front cover 154 and the end cover 162 for securement to one another.

The end cover 162 may include a flange 186 for securing the end cover 162 to a supporting surface, such as a tray (not shown in FIG. 3). For example, the flange 186 may include an aperture to receive a fastener for securing to the supporting surface.

FIGS. 4A through 4D illustrate another example of a portion of a power module assembly, referred to generally as a power module assembly 200 herein. The power module assembly 200 includes a front cover 204, an array of stacked power stage assemblies 206, and an end cover 208. The front cover 204 may be disposed at a first end of the array of stacked power stage assemblies 206 and the end cover 208 may be disposed at a second end of the array of stacked power stage assemblies 206. The covers may be arranged with one another to retain the array of stacked power stage assemblies 206 therebetween.

Each of a pair of side rails 212 extends from the front cover 204. The side rails 212 may be formed integrally with the front cover 204 or may be formed as separate components as further described below. Each of the side rails 212 may extend from the front cover 204 for orientation along a substantially central region relative to a height of the array of stacked power stage assemblies 206. Each of the pair of side rails 212 may extend along one of a first side or a second side of the array of power stage assemblies 206 and may extend a length of the array of stacked power stage assemblies 206. Each of the pair of side rails 212 may define a rail width 212a.

Each of the pair of side rails 212 includes features to secure the end cover 208 and the front cover 204 with the array of stacked power stage assemblies 206 therebetween. For example, each of the pair of side rails 212 may include a first attachment feature having a first receiving aperture 220 at one end of a respective side rail 212. The end cover 208 may include a pair of second attachment features each corresponding to one of the first attachment features of the pair of side rails 212. For example, the end cover 208 may include a pair of cutouts 213 and a pair of second receiving apertures 215. Each of the pair of cutouts 213 may be sized to receive a portion of one of the pair of side rails 212 and to orient the first receiving apertures for substantial registration with one of the second receiving apertures 215. In one example, each of the pair of cutouts 213 may include a base surface spaced from a side surface of the end cover 208 a distance substantially equal to a length of the rail width 212a.

Figure 4A:
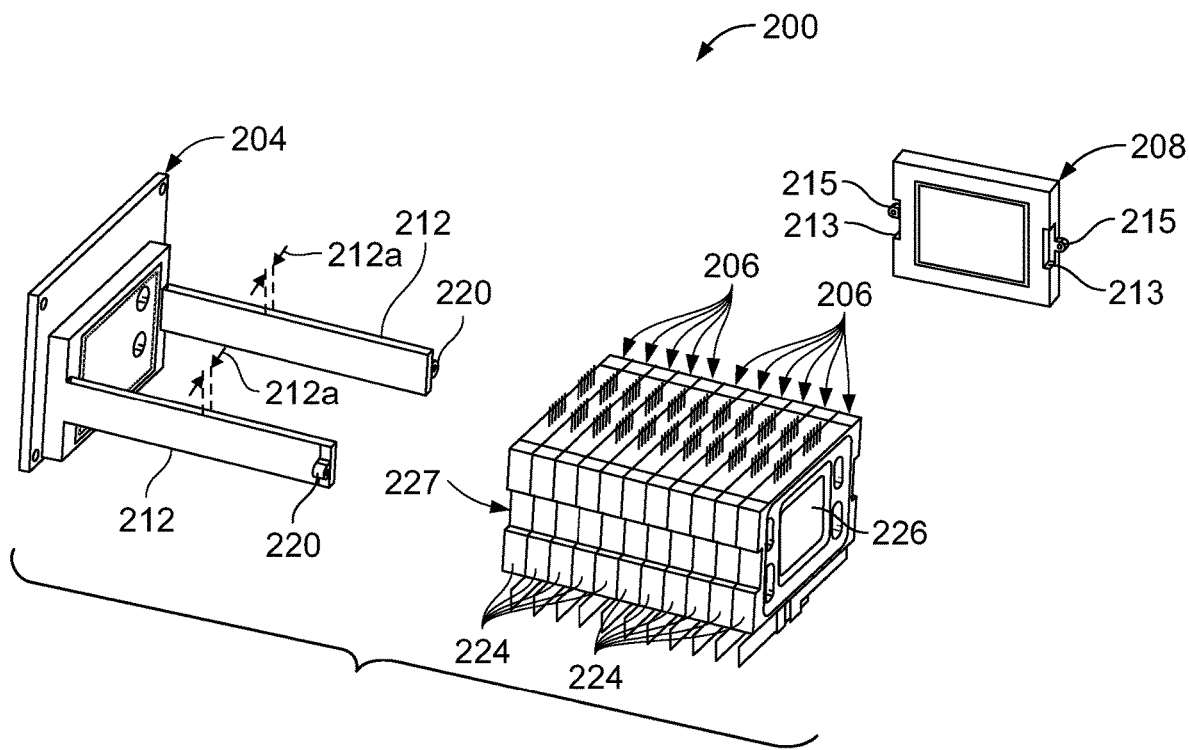
FIG. 4A is a partially exploded perspective view of an example of a portion of a power module assembly.
Figure 4B:
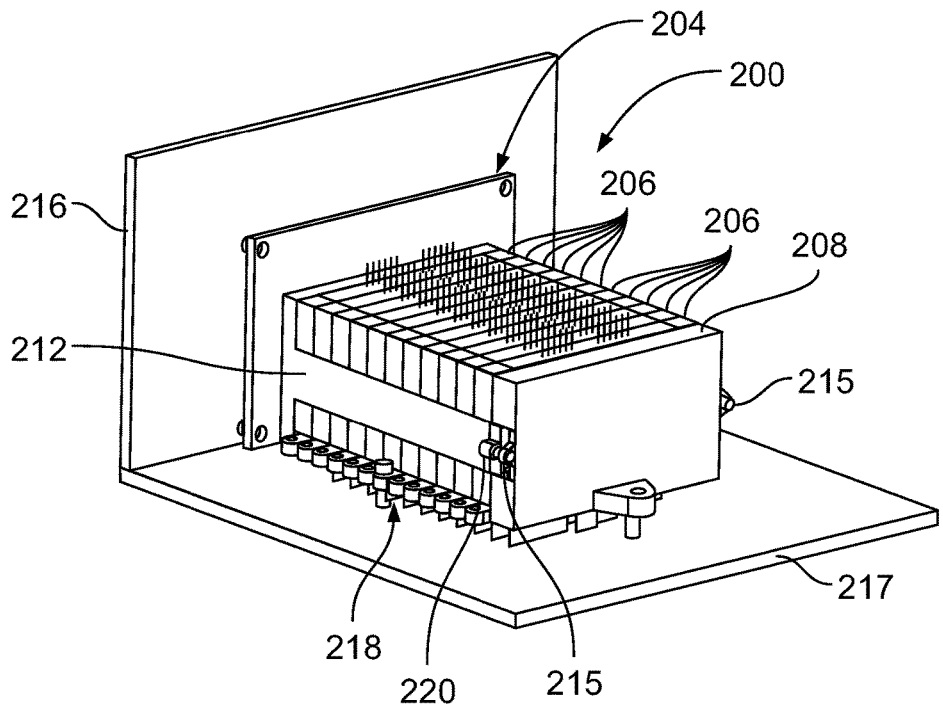
FIG. 4B is a perspective view of the portion of the power module assembly of FIG. 4A shown assembled.
Figure 4C:
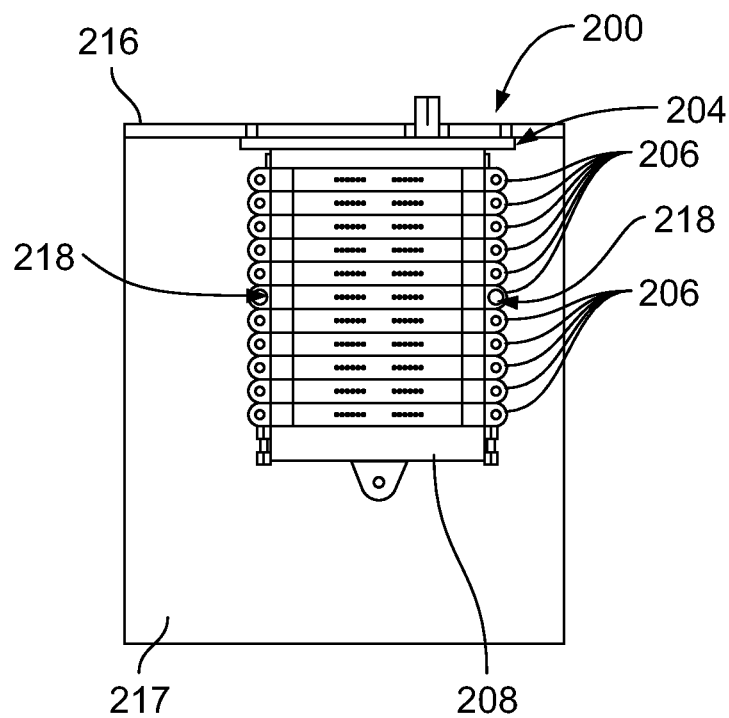
FIG. 4C is a top plan view of the portion of the power module assembly of FIG. 4B.
Figure 4D:
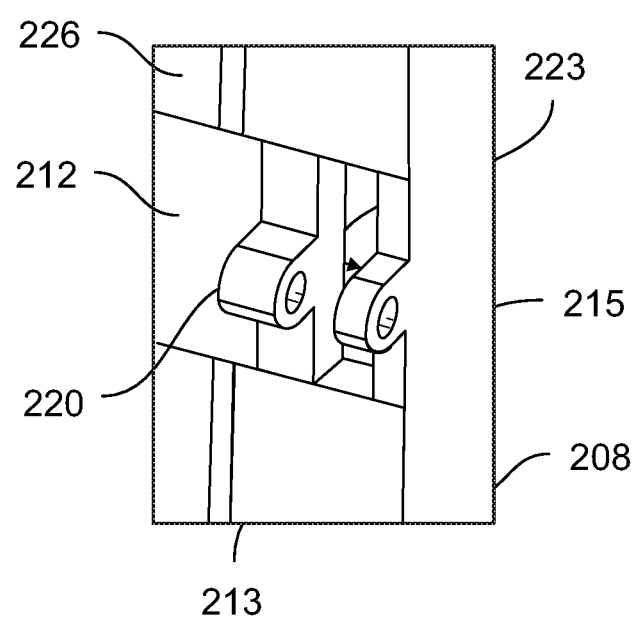
FIG. 4D is a detailed perspective view of a fastener region of the power module assembly of FIGS. 4A through 4C.

FIGS. 4B and 4C illustrate the power module assembly 200 mounted to a support structure in a perspective view and a top plan view, respectively. The support structure includes a vertical member 216 and a horizontal member 217. The front cover 204 may be secured to the vertical member 216 and the array of stacked power stage assemblies 206 and the end cover 208 may be secured to the horizontal member 217. In one example, one or more of the power stage assemblies 206 may include an attachment feature 218 for securing the power stage assemblies 206 to the horizontal member 217. In another example, the end cover 208 may include another attachment feature 219 for securing the end cover 208 to the horizontal member 217.

Each of the pair of side rails 212 may extend a length of the array of stacked power stage assemblies 206 plus approximately one half a width of the end cover 208 such that a gap 223 (best shown in FIG. 4D) is defined between a respective first receiving aperture 220 and a respective second aperture 215 prior to securement to one another. The gap 223 may assist in providing a clamping capability to snuggly retain the array of stacked power stage assemblies 206 between the front cover 204 and the end cover 208.

Each of the power stage assemblies 206 includes a frame 224 and a power stage 226. Each of the power stages 226 may define a cutout 227 located at a substantially central region relative to a height of the power stage 226. The cutout 227 may be sized based on the width 212a such that an outer surface of each side rail 212 is substantially flush with an outer surface of the respective power stage 226 when the power module assembly 200 is assembled. One or more electrical connectors may extend from a respective power stage 226. The array of stacked power stage assemblies 206 may be arranged with the front cover 204 and the end cover 208 such that each of the one or more electrical connectors is accessible by neighboring vehicle components.

Figure 5:
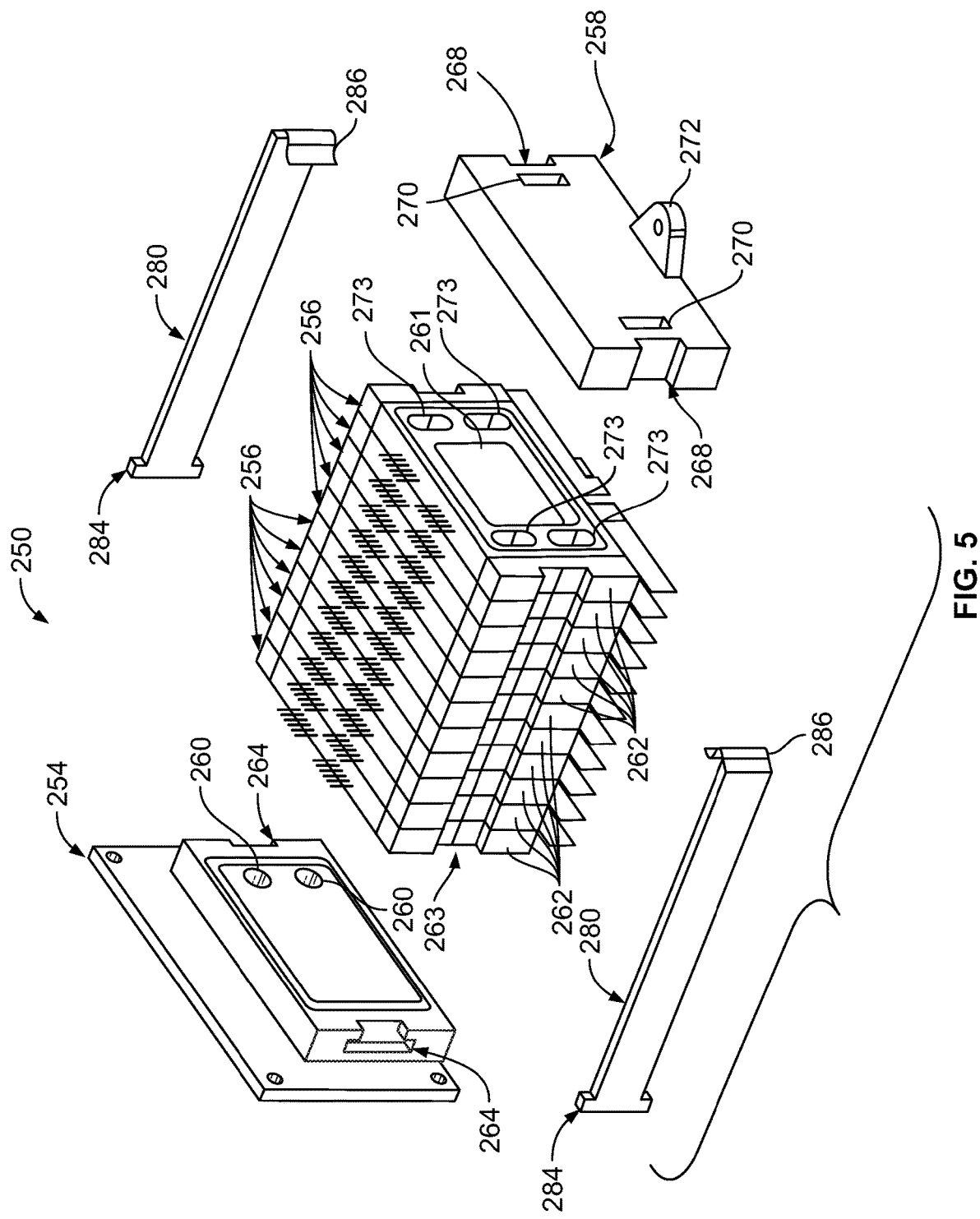
FIG. 5 is a partially exploded perspective view of an example of a portion of a power module assembly.

FIG. 5 is a partially exploded perspective view of another example of a power module assembly, referred to generally as a power module assembly 250 herein. The power module assembly 250 may include a front cover 254, an array of stacked power stage assemblies 256, and an end cover 258. The front cover 254 may be disposed at a first end of the array of stacked power stage assemblies 256.

The front cover 254 may include coolant inlet and outlet ports 260 for coolant delivery and removal to assist in managing thermal conditions of the array of stacked power stage assemblies 256. Each power stage assembly 256 may include a power stage 261 and a frame 262. Each of the frames 262 may include a cutout to define a surface 263 extending along the array of stacked power stage assemblies 256. The surface 263 is offset from an outer surface of respective frames 262. The front cover 254 may include a pair of T-shaped locating cutouts 264. The end cover 258 may include a pair of locating cutouts 268, a pair of through-holes 270, and a flange 272. Each of the frames 262 may further include one or more coolant channels 273 for coolant flow to assist in managing thermal conditions of the power stages 261.

A pair of side rails 280 may secure the front cover 254 to the end cover 258 such that the array of stacked power stage assemblies 256 is retained therebetween. Each of the pair of side rails 280 may be formed as a component separate from the front cover 254 and the end cover 258. Each of the pair of side rails 280 may include a T-shaped end 284. Each of the T-shaped ends 284 may be sized to sit within a respected T-shaped locating cutout 264 of the front cover 254. Each of the pair of side rails 280 may include a wave tab 286. Each of the wave tabs 286 may be sized such that a portion of a respective side rail 280 may rest within a respective locating cutout 268 while a portion of a respective wave tab 286 fits within one of the pair of through-holes 270. Each of the wave tabs 286 may fit within one of the pair of through-holes 270 via, for example, a snap-fit relationship. It is contemplated that each of the pair of through-holes 270 may be slots that do not extend completely through the end cover 258.

Figure 6A:
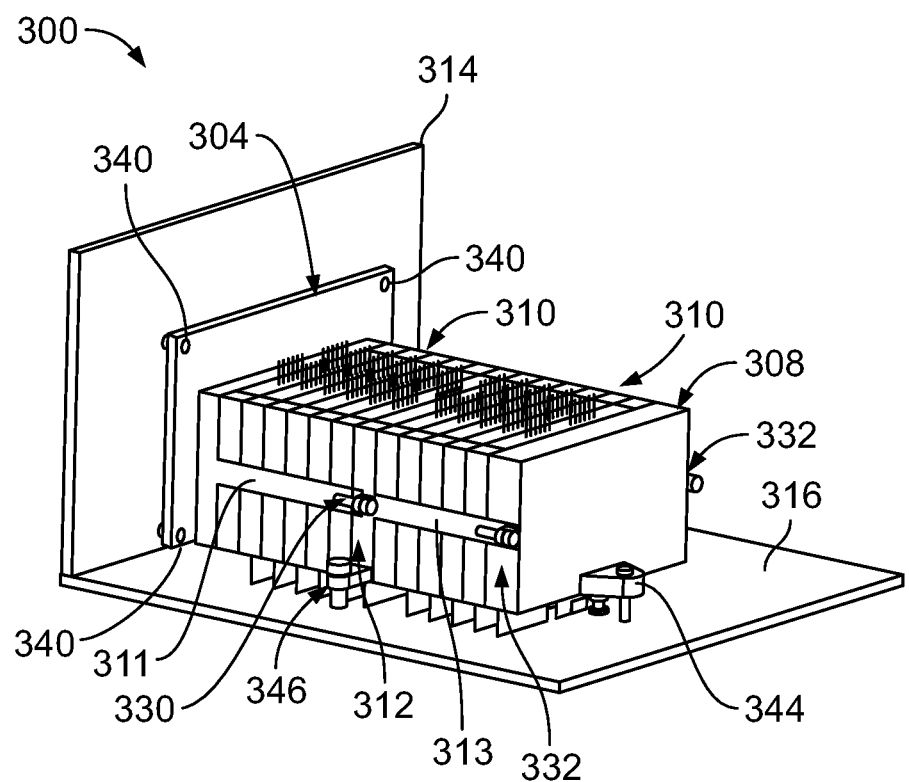
FIG. 6A is a perspective view of an example of a portion of a power module assembly.
Figure 6B:
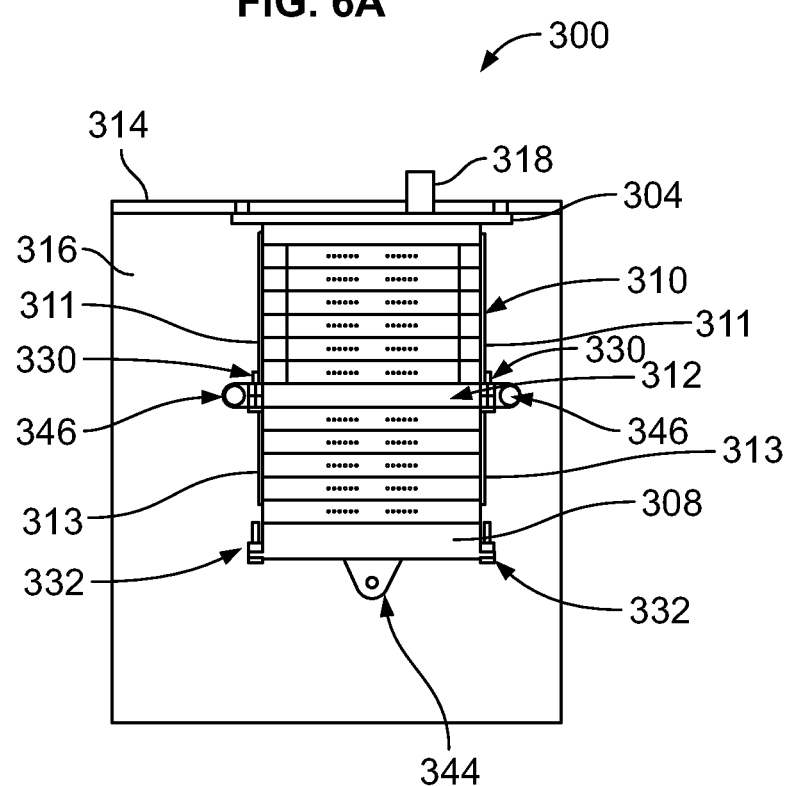
FIG. 6B is a top plan view of the portion of the power module assembly of FIG. 6A.

FIGS. 6A and 6B illustrate another example of a power module assembly, referred to generally as a power module assembly 300 herein. The power module assembly 300 may include a front cover 304, an end cover 308, and a stack of switch unit assemblies 310 retained therebetween. The front cover 304 may include a pair of first side rails 311 extending therefrom. An intermediate plate 312 may be disposed between switch unit assemblies 310 at a substantially central region of the stack of switch unit assemblies 310. It is contemplated that the intermediate plate 312 may be disposed at a region other than the central region based on structural requirements of the power module assembly 300. The intermediate plate 312 may include a pair of second side rails 313. The front cover 304, the end cover 308, and the intermediate plate 312 may be arranged with one another to retain the stack of switch unit assemblies 310 under a compression force. The applied compression force assists in creating a sealed relationship between the stack of switch unit assemblies 310 for thermal management benefits. For example, the intermediate plate 312 may operate as a heat sink and be positioned within the stack of switch unit assemblies 310 where additional thermal management is needed.

The power module assembly 300 may be mounted to an assembly housing including a vertical member 314 and a horizontal member 316. The assembly housing may be sized for mounting within a vehicle trunk, under a vehicle seat, or other similar locations with available packaging space. The vertical member 314 may define one or more ports for a coolant inlet/outlet to extend therethrough. For example, the vertical member 314 may define a port of a coolant channel 318 extending therethrough. The coolant channel 318 may be in fluid communication with a coolant source to facilitate coolant transfer to and from the power module assembly 300.

A first fastening feature 330 may assist in securing the front cover 304 to the intermediate plate 312 and a second fastening feature 332 may assist in securing the intermediate plate 312 to the end cover 308. For example, each of the pair of first side rails 311 may include a first cylindrical aperture of the first fastening feature 330 and the intermediate plate 312 may include a pair of second cylindrical apertures of the first fastening feature 330. It is contemplated that each of the first cylindrical apertures and the second cylindrical apertures may define shapes other than a cylinder. Each of the first cylindrical apertures may be oriented for substantial registration with one of the second cylindrical apertures to receive a fastener for securing the front cover 304 to the intermediate plate 312.

Each of the pair of second side rails 313 may include a third cylindrical aperture of the second fastening feature 332 and the end cover 308 may include a pair of fourth cylindrical aperture of the second fastening feature 332. It is contemplated that each of the third cylindrical apertures and the fourth cylindrical apertures may define shapes other than a cylinder. Each of the third cylindrical apertures may be oriented for substantial registration with one of the fourth cylindrical apertures to receive a fastener for securing the intermediate plate 312 to the end cover 308.

The power module assembly 300 may include additional attachment features for securement to the assembly housing. For example, the front cover 304 may include one or more apertures to receive fasteners for securement to the vertical member 314, such as apertures 340. As another example, the end cover 308 may include a flange 344 to receive a fastener for securing the end cover 308 to the horizontal member 316. As yet another example, the intermediate plate 312 may include a fastening feature 346 for securing the intermediate plate 312 to the horizontal member 316.

Figure 7:
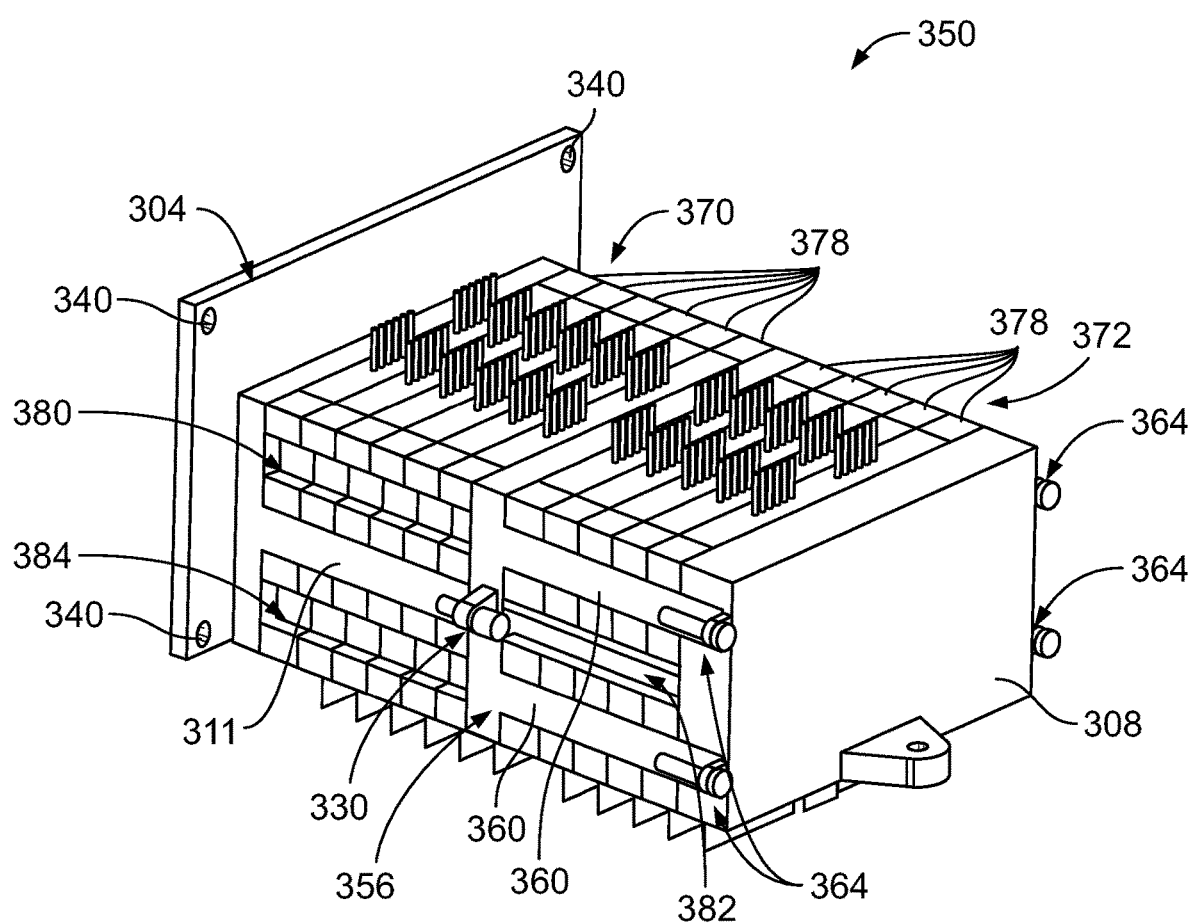
FIG. 7 is a perspective view of an example of a portion of a power module assembly.

FIG. 7 illustrates another example of a power module assembly, referred to generally as a power module assembly 350 herein. The power module assembly 350 may include components similar or the same as components of the power module assembly 300. For example, the power module assembly 350 may include the front cover 304 and the end cover 308. The front cover 304 may include the one or more apertures 340 to receive a fastener for securing the front cover 304 to a surface, such as a vertical member of a supporting assembly. The front cover 304 may include the pair of first side rails 311 (In FIG. 7 only one of the pair of first side rails 311 is visible due to an orientation of the power module assembly 350) for securing to an intermediate plate 356. A fastening feature, such as the first fastening feature 330, may facilitate securing the front cover 304 to the intermediate plate 356. In this example, the first fastening feature 330 may include a pair of first cylindrical apertures defined by the front cover 304 and a corresponding pair of fifth cylindrical aperture defined by the intermediate plate 356. The front cover 304 and the intermediate plate 356 may be arranged such that the first cylindrical aperture and the fifth cylindrical aperture are in substantial registration with one another for a fastener to extend therethrough and secure the front cover 304 to the intermediate plate 356.

The intermediate plate 356 may include two pairs of third side rails 360 (In FIG. 7 only one of each of the pairs of third side rails 360 is visible) for securing to the end cover 308. A fastening feature, such as third fastening features 364, may facilitate securing the intermediate plate 356 to the end cover 308. Each of the third side rails 360 may include a sixth cylindrical aperture of the third fastening feature 364 and the end cover 308 may include four seventh cylindrical apertures of the third fastening feature 364. Each of the seventh cylindrical apertures may correspond to one of the sixth cylindrical apertures. The end cover 308 and the intermediate plate 356 may be arranged with one another such that each of the sixth cylindrical apertures is in substantial registration with one of the seventh cylindrical apertures for a fastener to extend there through and secure the intermediate plate 356 to the end cover 308. The end cover 308 may include the flange 344 to receive a fastener for securing the end cover 308 to a supporting surface, such as a horizontal member of a supporting assembly.

A first array of stacked switch unit assemblies 370 may be disposed between the front cover 304 and the intermediate plate 356 and a second array of stacked switch unit assemblies 372 may be disposed between the intermediate plate 356 and the end cover 308. Each switch unit assembly may include a frame 378 housing a power stage (not visible in FIG. 7) therein.

Each frame 378 of the switch unit assemblies 370 and the switch unit assemblies 372 may define an upper cutout 380, a mid-cutout 382, and a lower cutout 384. Each of the cutouts may be defined on each outer side of a respective frame 378 such that respective cutouts are aligned when respective switch unit assemblies are retained by the front cover 304, the end cover 308, and the intermediate plate 356. For example, the mid-cutouts 382 of the frames 378 of the first array of switch unit assemblies may be aligned to each receive one of the pair of side rails 311. Each of the mid-cutouts 382 may define a depth substantially equal to a width of each of the pair of side rails 311. The width may be such that an outer surface of each of the pair of side rails 311 is substantially flush with or extends outward relative to an outer surface of each respective frame 378.

The upper cutouts 380 and the lower cutouts 384 of the second array of switch unit assemblies 372 may be aligned with respective cutouts to each receive one of the two pairs of side rails 360. Each of the upper cutouts 380 and the lower cutouts 384 may define a depth substantially equal to a width of each of the pair of side rails 360 such than an outer surface of each of the pair of side rails 360 is substantially flush with or extends outward relative to an outer surface of each respective frame 378.

Figure 8A:
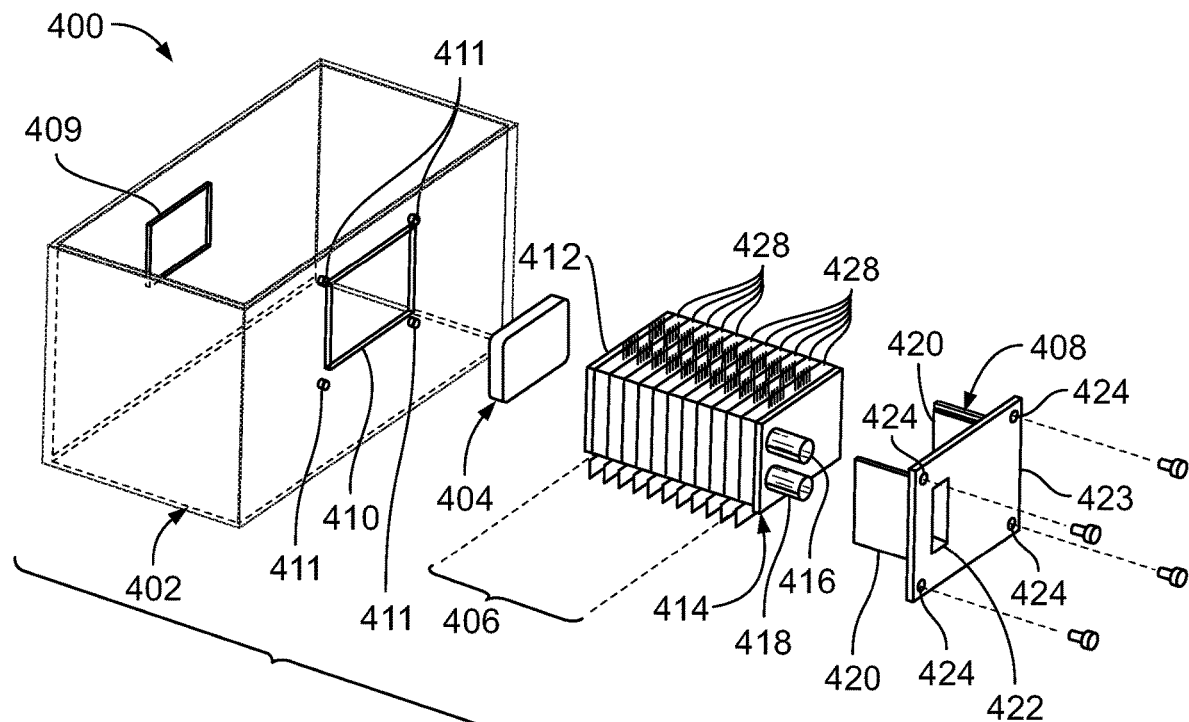
FIG. 8A is a partially exploded perspective view of an example of a portion of a power module assembly.
Figure 8B:
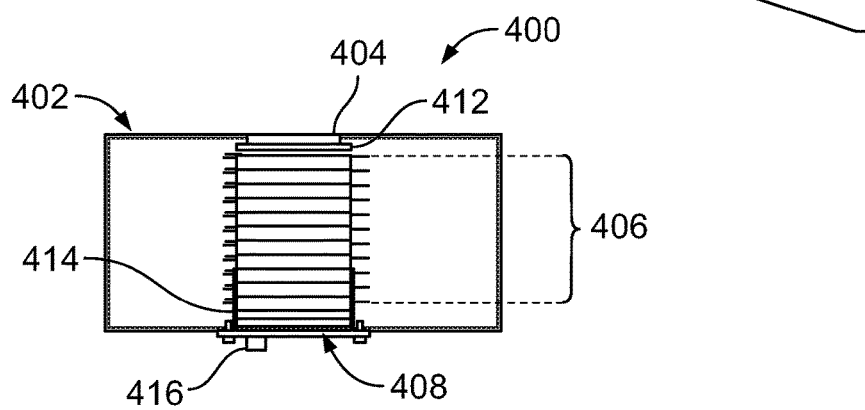
FIG. 8B is a top plan view of the portion of the power module assembly of FIG. 8A shown assembled.
Figure 8C:
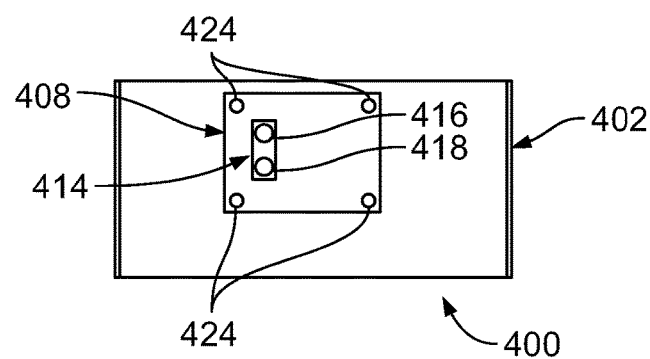
FIG. 8C is a front view of the portion of the power module assembly of FIG. 8A shown assembled.

FIGS. 8A through 8C illustrate another example of a power module assembly, referred to generally as a power module assembly 400 herein. FIG. 8A is a partially exploded perspective view of the power module assembly 400, FIG. 8B is a top plan view showing the power module assembly 400 assembled, and FIG. 8C is a front view of the power module assembly 400. The power module assembly 400 may include a housing 402, a spring element 404, an array of stacked switch unit assemblies 406, and a front cover 408. The housing 402 may include a spring mount feature 409, a cover through-hole 410, and one or more apertures 411.

The array of stacked switch unit assemblies 406 may be disposed between a first retention plate 412 and a second retention plate 414. The first retention plate 412 may be sized to align the spring element 404 with the spring mount feature 409. The second retention plate 414 may include an inlet 416 and an outlet 418 for coolant to be delivered to and removed from the array of stacked switch unit assemblies 406 to assist in managing thermal conditions thereof. The first retention plate 412 and the second retention plate 414 may be arranged with the array of stacked switch unit assemblies 406 for retention of the array of stacked switch unit assemblies 406 creating a sealed relationship therebetween.

The front cover 408 may include a pair of side rails 420, a coolant through-hole 422, and a plate 423 defining one or more apertures 424 to receive fasteners to secure the front cover 408 to the housing 402. Each of the pair of side rails 420 may define a height substantially equal to a height of each of a plurality of frames 428 of the array of stacked switch unit assemblies 406. Each of the pair of side rails 420 may extend along a portion of the array of stacked switch unit assemblies 406 a length less than a height of the pair of side rails 420. The array of stacked switch unit assemblies 406 and the front cover 408 may be arranged with one another such that the inlet 416 and the outlet 418 extend through the coolant through-hole 422 and such that each of the one or more apertures 411 are in substantial registration with one of the one or more apertures 424 for the fasteners to extend therethrough. The plate 423 may define a first area greater than a second area defined by the cover through-hole 410 such that the plate 423 closes off the cover through-hole 410 when the plate 423 is mounted to the housing 402.

Figure 9A:
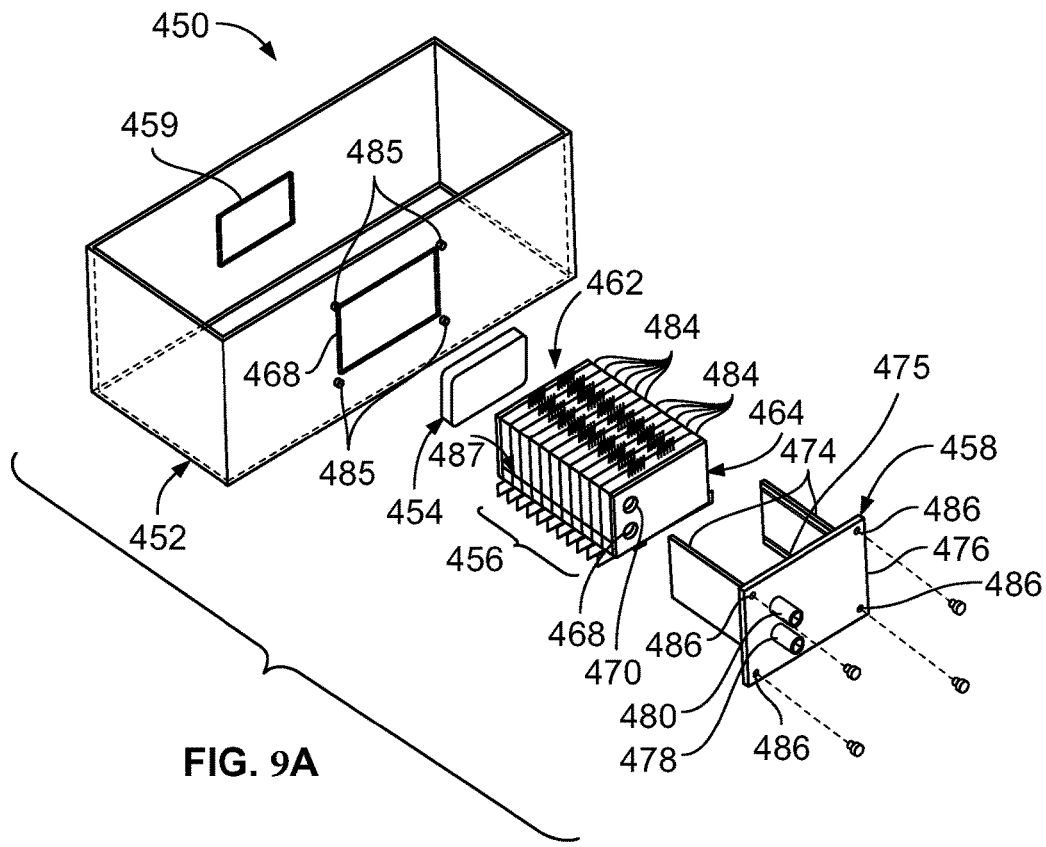
FIG. 9A is a partially exploded perspective view of an example of a portion of a power module assembly.
Figure 9B:
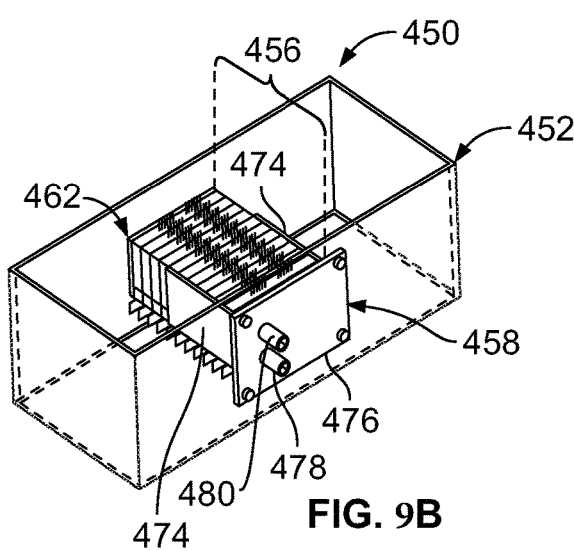
FIG. 9B is a perspective view of the portion of the power module assembly of FIG. 9A shown assembled.
Figure 9C:
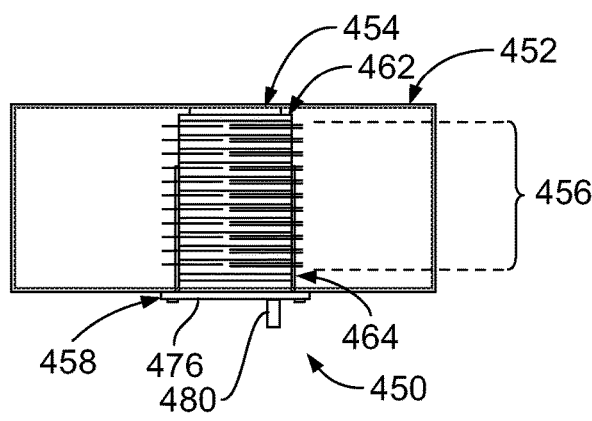
FIG. 9C is a top plan view of the portion of the power module assembly of FIG. 9A.

FIGS. 9A through 9C illustrate another example of a power module assembly, referred to generally as a power module assembly 450 herein. FIG. 9A is a partially exploded perspective view of the power module assembly 450, FIG. 9B is a perspective view of the power module assembly 450 shown assembled, and FIG. 9C is a top plan view of the power module assembly 450 shown assembled. The power module assembly 450 may include a housing 452, a spring element 454, an array of stacked switch unit assemblies 456, and a front cover 458. The housing 452 may include a spring mount feature 459 and a cover through-hole 460. The spring mount feature 459 may be sized for mounting the spring element 454 thereto.

The array of stacked switch unit assemblies 456 may be disposed between a first plate 462 and a second plate 464. The first plate 462 may be sized to align the spring element 454 with the spring mount feature 459. The second plate 464 may include a first port 468 and a second port 470 for coolant to be delivered to and removed from the array of stacked switch unit assemblies 456 to assist in managing thermal conditions thereof.

The front cover 458 may include a pair of side rails 474, a plate 476, a first coolant channel 478, and a second coolant channel 480. The cover through-hole 460 may be sized to receive the pair of side rails 474. Each of the pair of side rails 474 may define a height substantially equal to a height of each of a plurality of frames 484 of the array of stacked switch unit assemblies 456. Each of the pair of side rails 474 may extend along a portion of the array of stacked switch unit assemblies 456 a length greater than the height of each of the plurality of frames 484.

Each of the pair of side rails 474 may define a groove 475 to assist in securing the front cover 458 to the array of stacked switch unit assemblies 456. In FIG. 9A, only one of the grooves 475 is visible due to an orientation of the front cover 458. The array of stacked switch unit assemblies 456 and the front cover 458 may be arranged with one another such that the first port 468 is in substantial registration with the first coolant channel 478 and the second coolant channel 480 is in substantial registration with the second port 470 when the power module assembly 450 is assembled. The housing 452 and the front cover 458 may be arranged with one another such that each of a plurality of housing apertures 485 are in substantial registration with one of a plurality of cover apertures 486.

Each of the plurality of frames 484 may define an extension such that an extension 487 extends along a length of the array of stacked switch unit assemblies 456. In FIG. 9A, only one of the extensions 487 is visible due to an orientation of the stacked switch unit assemblies 456. The front cover 458 and the array of stacked switch unit assemblies 456 may be arranged with one another such that the extensions 487 may each interlock with one of the grooves 475.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power module assembly comprising: an array of stacked switch unit assemblies, each of the assemblies including a power stage frame having a mid cutout located at a substantially central side frame region such that a mid-cutout region is defined along each side of the array; a front cover disposed at a first end of the array; first and second side rails each extending from the front cover and each disposed within one of the mid-cutout regions such that an outer surface of each side rail is substantially flush with an outer surface of a respective power stage frame; an end cover arranged with the front cover to retain the therebetween: a spring element for mounting to the clamping plate such that the spring element is compressed against the damping plate and the end cover when the front cover and end cover are secured to one another, wherein each of the first and second side rails is integrated with the front cover and shaped to define a rectangle, and includes a first mating feature to connect with a second mating feature of the end cover, and wherein the rectangle includes an upper side extending along a lower portion of the array.

2. The assembly of claim 1, wherein each of the first and second side rails defines a groove extending a length of a respective side rail and spaced above a respective lower side rail portion, and wherein each of the power stage frames further defines an extension sized for disposal within one of the grooves.

3. The assembly of claim 1, wherein the front cover includes a pair of T-shaped locating cutouts and the end cover includes a pair of locating cutouts and a pair of through-holes, wherein each of the first and second side rails is a component separate from the front cover, includes a T-shaped end sized to sit within one of the pair of T-shaped locating cutouts, and includes a wave tab sized such that a portion of a respective side rail sits within one of the pair of locating cutouts of the end cover while a portion of a respective wave tab sits within one of the pair of through-holes.

4. The assembly of claim 1 further comprising an intermediate plate disposed between two switch unit assemblies at a substantially central region of the array of stacked switch unit assemblies and including a first fastening feature for securement to the front cover, another set of side rails each extending therefrom and disposed within respective cutout regions, and a second fastening feature for securement to the end cover.

5. The assembly of claim 4, wherein each of the another pair of side rails are aligned in parallel with the first and second side rails.

6. The assembly of claim 1 further comprising an intermediate plate disposed between two switch unit assemblies at a substantially central region of the array of stacked switch unit assemblies and including a pair of upper side rails and a pair of lower side rails, wherein each power stage frame further defines an upper cutout region and a lower cutout region, wherein the power stage frames are aligned such that the upper cutout regions and the lower cutout regions each extend along a length of the array on either side, and wherein the intermediate plate is arranged with the array of stacked switch unit assemblies such that each of the pair of upper side rails sits within one of the upper cutout regions and each of the pair of lower side rails sits within one of the lower cutout regions.

7. A vehicle power module assembly comprising:
a housing including a vertical member and a horizontal member;
a front cover for securing to the vertical member and including first and second side rails each including a first portion of a first fastening feature;
an end cover for securing to the horizontal member and including first portions of a second fastening feature each disposed on opposing sides of the end cover;
an array of stacked switch unit assemblies disposed between the covers and including a plurality of frames housing power stages; and
an intermediate plate centrally disposed within the array and including a third side rail, a fourth side rail, second portions of the first fastening feature, and second portions of the second fastening feature,
wherein each of the plurality of frames defines a mid-cutout to receive a portion of one of the side rails when the first and second portions of the first fastening feature are secured to one another and the first and second portions of the second fastening feature are secured to one another.

8. The assembly of claim 7, wherein the vertical member defines a coolant inlet and a coolant outlet each in fluid communication with the array of stacked switch unit assemblies for coolant delivery and coolant removal.

9. The assembly of claim 7, wherein the intermediate plate further includes first and second portions of a third fastening feature, and wherein the horizontal member includes third and fourth portions of the third fastening feature for alignment with respective first and second portions of the third fastening feature to secure the intermediate plate to the horizontal member and to increase a structural rigidity of the power module assembly.

10. The assembly of claim 7, wherein the front cover and the end cover are arranged with one another to orient the intermediate plate as a heat sink.

11. The assembly of claim 7, wherein each of the plurality of frames defines an upper cutout and a lower cutout with the mid-cutout therebetween, wherein the intermediate plate further includes a fifth side rail and a sixth side rail, and wherein the intermediate plate is arranged with the array of stacked switch unit assemblies such that the third side rail and the fourth side rail are disposed within one of the upper cutout and the lower cutout and the fifth side rail and the sixth side rail are disposed within the other of the upper cutout and the lower cutout.

12. The assembly of claim 7, wherein each of the first and second side rails defines a length substantially equal to at least a width of two of the plurality of frames.

13. The assembly of claim 7, wherein the covers, side rails, and frames are arranged with one another such that array of switch unit assemblies is sealed when stacked due to a compression force received from the side rails.

14. A vehicle power module assembly comprising: a housing defining a cavity and a through-hole; a cover including a plate defining a plate area greater than a through-hole area, and including first and second side rails extending from the plate through the through-hole; and an array of switch unit assemblies within the cavity; and a spring element, wherein each of the side rails extends a length substantially equal to a length of at least two of the switch unit assemblies, the housing includes a spring holding feature located opposite the through-hole and arranged upon the housing to retain the spring element at a location such that the array of switch unit assemblies is sealed when stacked due to a compression force received from the cover to the housing.

15. The assembly of claim 14, wherein the plate includes an integrated coolant inlet and an integrated coolant outlet, and wherein each of the integrated coolant inlet and the integrated coolant outlet define a coolant channel in fluid communication with the array of switch unit assemblies for coolant delivery and removal.

16. The assembly of claim 14, wherein the housing further defines one or more housing apertures each located adjacent one of four corners of the through-hole, wherein the cover further defines one or more cover apertures each corresponding to one of the one or more housing apertures, wherein each of the one or more housing apertures are in substantial registration with one of the one or more cover apertures to receive a fastener, and wherein the one or more housing apertures and the one or more cover apertures are arranged with one another such that the plate covers the through-hole when secured to the housing.

17. The assembly of claim 14, wherein each of the array of switch unit assemblies includes a frame to retain at least two switch units therein, wherein each of the first and second side rails defines a height substantially equal to a height of one of the frames, and wherein the height is greater than a length defined by each of the first and second side rails.

18. The assembly of claim 14, wherein each of the array of switch unit assemblies includes a frame to retain at least two switch units therein, wherein each of the first and second side rails includes a groove extending a length thereof and spaced above a respective lower rail portion, and wherein each of the frames defines an extension sized for disposal within one of the grooves.

\* \* \* \* \*